United States Patent
Hall et al.

(10) Patent No.: US 8,728,886 B2
(45) Date of Patent: May 20, 2014

(54) INTEGRATING FORMATION OF A REPLACEMENT GATE TRANSISTOR AND A NON-VOLATILE MEMORY CELL USING A HIGH-K DIELECTRIC

(75) Inventors: Mark D. Hall, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 9 days.

(21) Appl. No.: 13/491,771

(22) Filed: Jun. 8, 2012

(65) Prior Publication Data

US 2013/0330893 A1    Dec. 12, 2013

(51) Int. Cl.
*H01L 21/00* (2006.01)
(52) U.S. Cl.
USPC .................. 438/241; 438/258; 257/E21.084
(58) Field of Classification Search
CPC ............ H01L 21/8239; H01L 21/8229; H01L 27/105; H01L 27/1052; H01L 27/11531; H01L 27/11534; H01L 27/11536; H01L 27/11539; H01L 27/11543
USPC ................................................ 438/584–688
See application file for complete search history.

(56) References Cited

U.S. PATENT DOCUMENTS

| | | | |
|---|---|---|---|
| 5,614,746 A | 3/1997 | Hong et al. | |
| 6,087,225 A | 7/2000 | Bronner et al. | |
| 6,194,301 B1 | 2/2001 | Radens et al. | |
| 6,235,574 B1 | 5/2001 | Tobben et al. | |
| 6,333,223 B1 * | 12/2001 | Moriwaki et al. | 438/241 |
| 6,388,294 B1 | 5/2002 | Radens et al. | |
| 6,509,225 B2 | 1/2003 | Moriwaki et al. | |
| 6,531,734 B1 | 3/2003 | Wu | |
| 6,635,526 B1 | 10/2003 | Malik et al. | |
| 6,707,079 B2 | 3/2004 | Satoh et al. | |
| 6,777,761 B2 | 8/2004 | Clevenger et al. | |
| 6,939,767 B2 | 9/2005 | Hoefler et al. | |

(Continued)

FOREIGN PATENT DOCUMENTS

WO    2009058486    5/2009

OTHER PUBLICATIONS

U.S. Appl. No. 13/491,760, Office Action—Notice of Allowance, mailed Jul. 1, 2013.

(Continued)

*Primary Examiner* — Seahvosh Nikmanesh
*Assistant Examiner* — Evren Seven
(74) *Attorney, Agent, or Firm* — James L. Clingan, Jr.; Joanna G. Chiu

(57) ABSTRACT

A first dielectric layer is formed in an NVM region and a logic region. A charge storage layer is formed over the first dielectric layer and is patterned to form a dummy gate in the logic region and a charge storage structure in the NVM region. A second dielectric layer is formed in the NVM and logic regions which surrounds the charge storage structure and dummy gate. The second dielectric layer is removed from the NVM region while protecting the second dielectric layer in the logic region. The dummy gate is removed, resulting in an opening. A third dielectric layer is formed over the charge storage structure and within the opening, and a gate layer is formed over the third dielectric layer and within the opening, wherein the gate layer forms a control gate layer in the NVM region and the gate layer within the opening forms a logic gate.

20 Claims, 13 Drawing Sheets

(56) References Cited

U.S. PATENT DOCUMENTS

| | | | |
|---|---|---|---|
| 7,154,779 | B2 | 12/2006 | Mokhlesi et al. |
| 7,202,524 | B2 | 4/2007 | Kim et al. |
| 7,208,793 | B2 | 4/2007 | Bhattacharyya |
| 7,271,050 | B2 | 9/2007 | Hill |
| 7,365,389 | B1 | 4/2008 | Jeon et al. |
| 7,391,075 | B2 | 6/2008 | Jeon et al. |
| 7,405,968 | B2 | 7/2008 | Mokhlesi et al. |
| 7,439,134 | B1 | 10/2008 | Prinz et al. |
| 7,476,582 | B2 | 1/2009 | Nakagawa et al. |
| 7,544,490 | B2 | 6/2009 | Ferrari et al. |
| 7,544,980 | B2 | 6/2009 | Chindalore et al. |
| 7,544,990 | B2 | 6/2009 | Bhattacharyya |
| 7,560,767 | B2 | 7/2009 | Nishikawa |
| 7,795,091 | B2 | 9/2010 | Winstead et al. |
| 7,816,727 | B2 | 10/2010 | Lai et al. |
| 7,906,396 | B1 | 3/2011 | Chiang et al. |
| 7,989,871 | B2 | 8/2011 | Naoki |
| 7,999,304 | B2 | 8/2011 | Ozawa et al. |
| 8,063,434 | B1 | 11/2011 | Polishchuk et al. |
| 8,138,037 | B2 | 3/2012 | Chudzik et al. |
| 8,168,493 | B2 * | 5/2012 | Kim .............................. 438/238 |
| 8,298,885 | B2 | 10/2012 | Wei et al. |
| 8,334,198 | B2 | 12/2012 | Chen et al. |
| 8,372,699 | B2 | 2/2013 | Kang et al. |
| 8,389,365 | B2 | 3/2013 | Shroff et al. |
| 8,399,310 | B2 | 3/2013 | Shroff et al. |
| 8,524,557 | B1 | 9/2013 | Hall et al. |
| 8,536,006 | B2 | 9/2013 | Shroff et al. |
| 8,536,007 | B2 | 9/2013 | Hall et al. |
| 2002/0061616 | A1 | 5/2002 | Kim et al. |
| 2004/0075133 | A1 * | 4/2004 | Nakagawa et al. ........... 257/314 |
| 2006/0046449 | A1 | 3/2006 | Liaw |
| 2007/0077705 | A1 | 4/2007 | Prinz et al. |
| 2007/0215917 | A1 | 9/2007 | Taniguchi |
| 2007/0224772 | A1 | 9/2007 | Hall et al. |
| 2007/0249129 | A1 | 10/2007 | Hall et al. |
| 2007/0264776 | A1 | 11/2007 | Dong et al. |
| 2008/0050875 | A1 | 2/2008 | Moon et al. |
| 2008/0121983 | A1 | 5/2008 | Seong et al. |
| 2008/0145985 | A1 | 6/2008 | Chi |
| 2008/0185635 | A1 | 8/2008 | Yanagi et al. |
| 2008/0237700 | A1 | 10/2008 | Kim et al. |
| 2008/0290385 | A1 | 11/2008 | Urushido |
| 2008/0308876 | A1 | 12/2008 | Lee et al. |
| 2009/0065845 | A1 | 3/2009 | Kim et al. |
| 2009/0072274 | A1 | 3/2009 | Knoefler et al. |
| 2009/0078986 | A1 | 3/2009 | Bach |
| 2009/0101961 | A1 | 4/2009 | He et al. |
| 2009/0111229 | A1 | 4/2009 | Steimle et al. |
| 2009/0179283 | A1 | 7/2009 | Adams et al. |
| 2009/0225602 | A1 | 9/2009 | Sandhu et al. |
| 2009/0256211 | A1 | 10/2009 | Booth et al. |
| 2009/0273013 | A1 | 11/2009 | Winstead et al. |
| 2009/0278187 | A1 | 11/2009 | Toba |
| 2011/0031548 | A1 | 2/2011 | White et al. |
| 2011/0095348 | A1 | 4/2011 | Chakihara et al. |
| 2011/0204450 | A1 | 8/2011 | Moriya |
| 2012/0104483 | A1 | 5/2012 | Shroff et al. |
| 2012/0132978 | A1 | 5/2012 | Toba et al. |
| 2012/0248523 | A1 | 10/2012 | Shroff et al. |
| 2012/0252171 | A1 | 10/2012 | Shroff et al. |
| 2013/0026553 | A1 | 1/2013 | Horch |
| 2013/0037886 | A1 | 2/2013 | Tsai et al. |
| 2013/0065366 | A1 | 3/2013 | Thomas et al. |
| 2013/0171785 | A1 | 7/2013 | Shroff et al. |
| 2013/0171786 | A1 | 7/2013 | Shroff et al. |
| 2013/0178027 | A1 | 7/2013 | Hall et al. |
| 2013/0178054 | A1 | 7/2013 | Shroff et al. |
| 2013/0264633 | A1 | 10/2013 | Hall et al. |
| 2013/0264634 | A1 | 10/2013 | Hall et al. |
| 2013/0267074 | A1 | 10/2013 | Hall et al. |

OTHER PUBLICATIONS

Chen, J.H., et al., "Nonvolatile Flash Memory Device Using Ge Nanocrystals Embedded in HfA1O High-k Tunneling and Control Oxides: Device Fabrication and Electrical Performance", IEEE Transactions on Electron Devices, vol. 51, No. 11, Nov. 2004, pp. 1840-1848.

Kang, T.K., et al., "Improved characteristics for Pd nanocrystal memory with stacked HfAIO-Si02 tunnel layer", Sciencedirect.com, Solid-State Electronics, vol. 61, Issue 1, Jul. 2011, pp. 100-105, http://www.sciencedirect.com/science/article/pii/S0038110111000803.

Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1.4, pp. 634-637.

Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.

Liu, Z., et al., "Metal Nanocrystal Memories—Part I: Device Design and Fabrication", IEEE Transactions on Electron Devices, vol. 49, No. 9, Sep. 2002, pp. 1606-1613.

Mao, P., et al., "Nonvolatile memory devices with high density ruthenium nanocrystals", Applied Physics Letters, vol. 93, Issue 24, Electronic Transport and Semiconductors, 2006.

Mao, P., et al. "Nonvolatile Memory Characteristics with Embedded high Density Ruthenium Nanocrystals", http://lopsciencelop.org/0256-307X/2615/056104, Chinese Physics Letters, vol. 26, No. 5, 2009.

Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.

Wang, X.P., et al., Dual Metal Gates with Band-Edge Work Functions on Novel HfLaO High-K Gate Dielectric, IEEE, Symposium on VLSI Technology Digest of Technical Papers, 2006.

U.S. Appl. No. 13/402,426, Hall, M.D., et al., "Non-Volatile Memory Cell and Logic Transistor Integration", Office Action—Allowance—May 3, 2013.

U.S. Appl. No. 13/789,971, Hall, M.D., et al, "Integration Technique Using Thermal Oxide Select Gate Dielectric for Select Gate and Replacement Gate for Logic ", Office Action—Allowance—May 15, 2013.

U.S. Appl. No. 13/781,727, Shroff, M., et al., "Methods of Making Logic Transistors and non-Volatile Memory Cells", Office Action—Restriction, Jun. 21, 2013.

U.S. Appl. 13/442,142, Hall, M.D., et al., "Logic Transistor and Non-Volatile Memory Cell Integration", Office Action—Ex Parte Quayle, Apr. 4, 2013.

U.S. Appl. 13/442,142, Hall, M.D., et al., "Logic Transistor and Non-Volatile Memory Cell Integration", Office Action—Allowance, Aug. 2, 2013.

U.S. Appl. No. 13/907,491, Hall, M.D., et al., "Logic Transistor and Non-Volatile Memory Cell Integration", Office Action—Rejection, Sep. 3, 2013.

U.S. Appl. No. 12/915,726, Shroff, M., et al., "Non-Volatile Memory and Logic Circuit Process Integration", Office Action—Restriction, Jul. 31, 2012.

U.S. Appl. No. 12/915,726, Shroff, M., et al., "Non-Volatile Memory and Logic Circuit Process Integration", Office Action—Allowance, Dec. 10, 2012.

U.S. Appl. No. 13/781,727, Shroff, M., et al., "Methods of Making Logic Transistors and non-Volatile Memory Cells", Office Action—Rejection, Aug. 22, 2013.

U.S. Appl. No. 13/077,491, Shroff, M., et al., "Non-Volatile Memory and Logic Circuit Process Integration", Office Action—Rejection, Aug. 15, 2012.

U.S. Appl. No. 13/077,491, Shroff, M., et al., "Non-Volatile Memory and Logic Circuit Process Integration", Office Action—Rejection, Feb. 6, 2013.

U.S. Appl. No. 13/077,491, Shroff, M., et al., "Non-Volatile Memory and Logic Circuit Process Integration", Office Action—Allowance, Jun. 18, 2013.

(56) References Cited

OTHER PUBLICATIONS

U.S. Appl. No. 13/077,501, Shroff, M., et al., "Non-Volatile Memory and Logic Circuit Process Integration", Office Action—Allowance, Nov. 26, 2012.
U.S. Appl. No. 13/313,179, Shroff, M., et al., "Method of Protecting Against Via Failure and Structure Therefor", Office Action—Rejection, Aug. 15, 2013.
U.S. Appl. No. 13/307,719, Shroff, M., et al., "Logic and Non-Volatile Memory (NVM) Integration", Office Action—Allowance, May 29, 2013.
U.S. Appl. No. 13/343,331, Shroff, M., et al., "Non-Volatile Memory (NVM) and Logic Integration", Office Action—Rejection, Mar. 13, 2013.
U.S. Appl. No. 13/343,331, Shroff, M., et al., "Non-Volatile Memory (NVM) and Logic Integration", Office Action—Allowance, Jun. 24, 2013.
U.S. Appl. No. 13/441,426, Shroff, M., et al., "Non-Volatile Memory (NVM) and Logic Integration", Office Action—Allowance, Sep. 9, 2013.
U.S. Appl. No. 13/780,574, Hall, M.D., et al., Non-Volatile Memory (NVM) and Logic Integration, Office Action—Allowance, Sep. 6, 2013.
U.S. Appl. No. 13/780,591, Hall, M.D., et al., "Non-Volatile Memory (NVM) and Logic Integration", filed Feb. 28, 2013 .
U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/442,142, Hall, M.D., et al., "Logic Transistor and Non-Volatile Memory Cell Integration", Office Action—Allowance, mailed Dec. 31, 2013.
U.S. Appl. No. 13/790,225, Hall, Mark D., et al., "Integrating Formation of a Replacement Gate Transistor and a Non-Volatile Memory Cell Having Thin Film Storage", Office Action—Allowance, mailed Dec. 24, 2013.
U.S. Appl. No. 13/790,014, Hall, Mark D., et al., Integrating Formation of a Logic Transistor and a Non-Volatile Memory Cell Using a Partial Replacement Gate Technique, Office Action—Allowance, mailed Dec. 24, 2013.
U.S. Appl. No. 13/781,727, Shroff, M., et al., "Methods of Making Logic Transistors and non-Volatile Memory Cells", Office Action—Allowance, mailed Jan. 31, 2014.
U.S. Appl. No. 13/343,331, Shroff, M., et al., "Non-Volatile Memory (NVM) and Logic Integration", Office Action—Allowance, Nov. 8, 2013.
U.S. Appl. No. 13/780,574, Hall, M.D., et al., Non-Volatile Memory (NVM) and Logic Integration, Office Action—Allowance, Dec. 24, 2013.
U.S. Appl. No. 13/780,591, Hall, M.D., et al., "Non-Volatile Memory (NVM) and Logic Integration", filed Nov. 22, 2013.
Office Action mailed Feb. 21, 2014 in U.S. Appl. No. 13/441,426.
Office Action mailed Feb. 28, 2014 in U.S. Appl. No. 13/442,142.
Office Action mailed Mar. 3, 2014 in U.S. Appl. No. 13/790,014.
Office Action mailed Mar. 11, 2014 in U.S. Appl. No. 13/907,491.
Office Action mailed Mar. 12, 2014 for U.S. Appl. No. 13/790,225.

\* cited by examiner

INTEGRATING FORMATION OF A REPLACEMENT GATE TRANSISTOR AND A NON-VOLATILE MEMORY CELL USING A HIGH-K DIELECTRIC

CROSS-REFERENCE TO RELATED APPLICATIONS

This application is related to U.S. patent application Ser. No. 13/491,760, filed on even date, entitled "INTEGRATING FORMATION OF A REPLACEMENT GATE TRANSISTOR AND A NON-VOLATILE MEMORY CELL USING AN INTERLAYER DIELECTRIC," naming Mehul Shroff and Mark Hall as inventors, and assigned to the current assignee hereof.

BACKGROUND

1. Field

This disclosure relates generally to integrating formation of a replacement gate and a non-volatile memory cell, and more specifically, to integrating formation of a replacement gate and a non-volatile memory cell using a high-k dielectric.

2. Related Art

Non-volatile memories (NVMs) are often on an integrated circuit which also performs other functions. In such cases it is undesirable to sacrifice logic performance in favor of performance of the NVM. Also it is important to avoid or minimize additional cost in achieving high performance for both the logic and the NVM. Replacement gate, which is a technique for enhancing performance by using a dummy gate for the formation of source/drains and then replacing the dummy gate with a higher performance gate such as one with higher conductance and an optimized work function, has shown promise in improving performance. Replacement gate is particularly helpful in achieving both metal gate and using a high-k dielectric for the gate dielectric.

Accordingly there is a need to provide further improvement in achieving high performance while also addressing cost increase issues in integrated circuits that have both NVM and logic, particularly in the context of replacement gate.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

An integration in making a replacement gate transistor and a non-volatile memory (NVM) cell includes forming a charge storage layer in an NVM portion and a dummy gate of charge storage layer material in a logic portion. An interlayer dielectric (ILD) is formed in both NVM portion around the charge storage layer and in the logic portion around the replacement gate. The ILD is removed from around the charge storage material in the NVM portion while being retained in the logic portion. A blocking dielectric is formed on top of and on sides of the charge storage layer. A control gate is formed on the blocking dielectric so as to be over the top of and along the sides of the charge storage layer. Also an integration in making a replacement gate transistor and a non-volatile memory (NVM) cell includes forming a charge storage layer in an NVM portion and a dummy gate of charge storage layer material in a logic portion such that a high-k dielectric is formed after removing a dummy gate so that the high-k dielectric is over the charge storage material and on a semiconductor material at a bottom of an opening left by the removal of the dummy gate. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
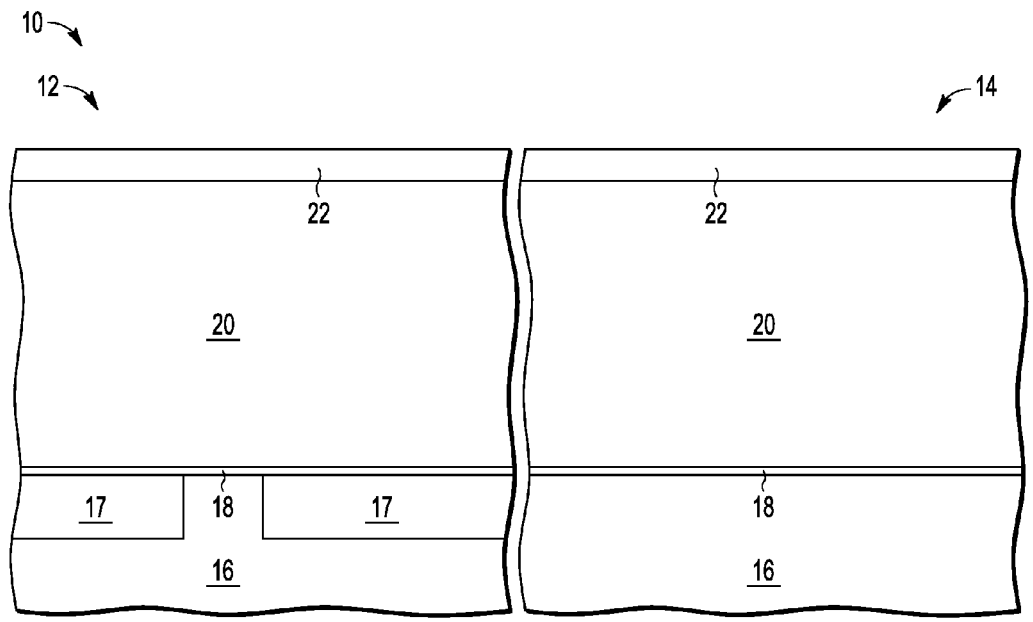
FIG. 1 is a cross section of a non-volatile memory cell and a replacement gate transistor at a stage in processing according to a first embodiment.

Shown in FIG. 1 is a semiconductor device 10 having non-volatile memory (NVM) portion 12 and a logic portion 14 formed over a semiconductor substrate 16. In NVM portion 12 is a dielectric layer 17 that functions as an isolation region and is of an appropriate depth for that purpose. Substrate 16 has a portion between regions of dielectric layer 17 that defines an active region useful in forming an NVM cell. Over substrate 16 in both the NVM and logic portions is a dielectric layer 18 that is useful as a gate dielectric for an NVM cell. Dielectric layer 18 may be a high-k dielectric or other dielectric, such as thermally grown oxide for example, that may be used as a tunnel dielectric. A charge storage layer 20 is over dielectric 18. Charge storage layer 20 may be polysilicon or some other material useful as a floating gate. Another possibility is that charge storage layer 20 could be nitride. The primary example explained herein is for charge storage layer 20 being polysilicon. If nitride is chosen, then some variations in other layers will be required for the needed selective etching. A hard mask layer 22 is over charge storage layer 20. Hard mask layer 22 may be nitride if charge storage layer 20 is polysilicon and oxide if charge storage layer 20 is nitride.

Figure 2:
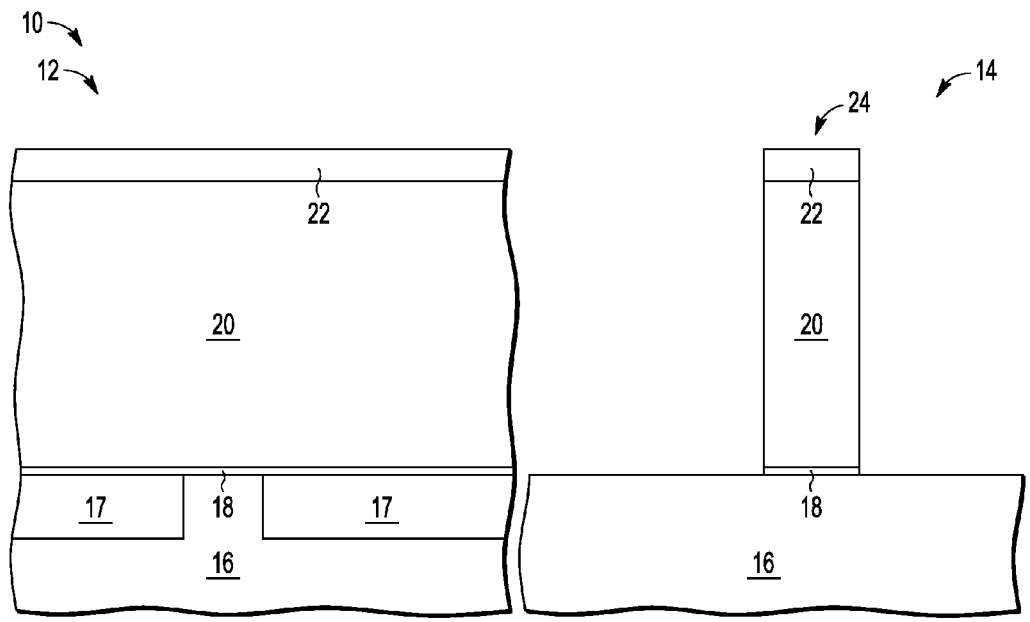
FIG. 2 is a cross section of a non-volatile memory cell and a replacement gate transistor of FIG. 1 at a subsequent stage in processing.

Shown in FIG. 2 is semiconductor device 10 after etching charge storage layer 20 into a dummy gate 24 in logic portion 14. NVM portion 12 is masked during the formation of dummy gate 24. Hard mask 22 is useful in providing protection for etching through charge storage layer 20. Dummy gate 24 will be replaced by a logic gate in subsequent processing.

Figure 3:
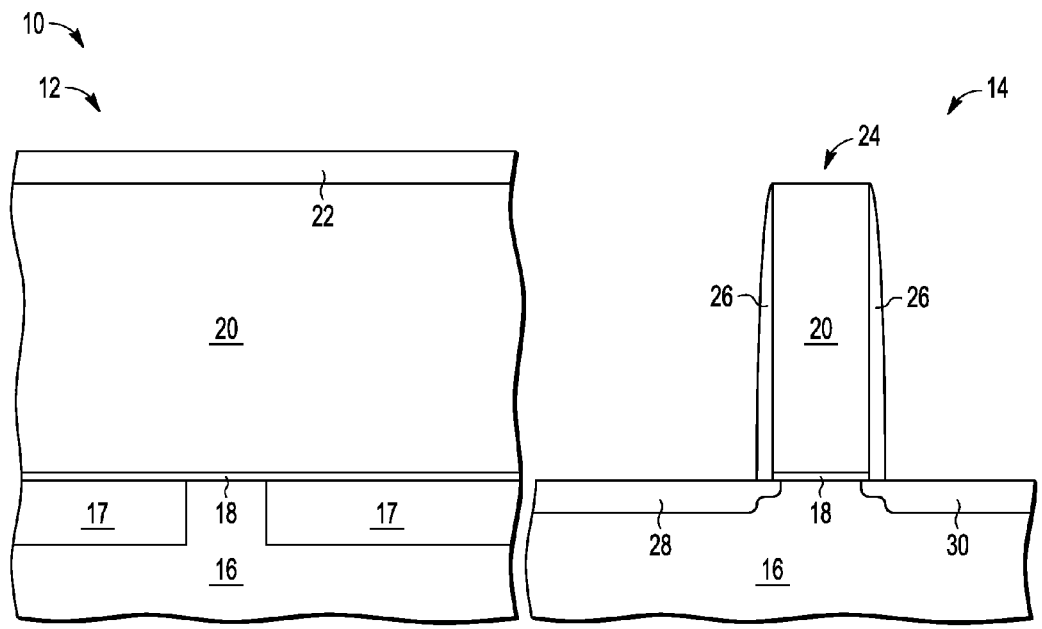
FIG. 3 is a cross section of a non-volatile memory cell and a replacement gate transistor of FIG. 2 at a subsequent stage in processing.

Shown in FIG. 3 is semiconductor device 10 after forming, in logic portion 14, a sidewall spacer 26 around dummy gate 24, a source/drain region 28 in substrate 16 on a first side of dummy gate 24, and a source/drain region 30 on a second side of dummy gate 24. The portion of hard mask 22 over dummy gate 24 may be removed during this sequence of steps or subsequently during a chemical mechanical polishing (CMP) step as part of FIG. 5 below.

Figure 4:
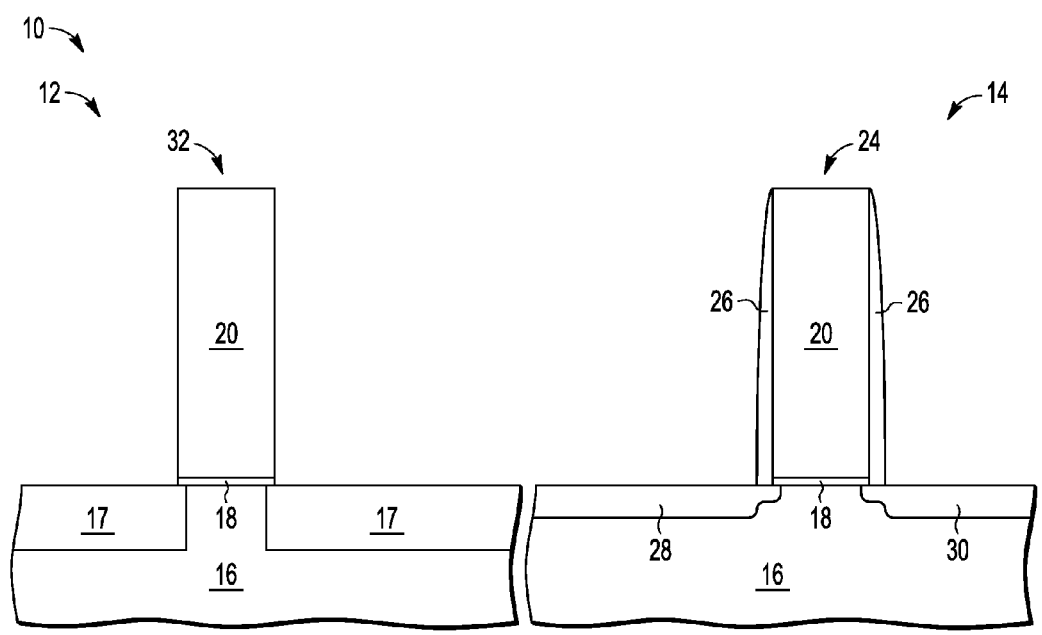
FIG. 4 is a cross section of a non-volatile memory cell and a replacement gate transistor of FIG. 3 at a subsequent stage in processing.

Shown in FIG. 4 is semiconductor device 10 after pattern etching charge storage layer 20 to form a charge storage structure 32. Two sides of charge storage structure 32 are shown in FIG. 4. Both of these sides shown in FIG. 4 extend over dielectric layer 17. This etch results in charge storage structure 32 running in a bit line direction of an NVM array having a plurality of NVM cells of which one NVM cell will be finished in NVM portion 12 shown in FIG. 4.

Figure 5:
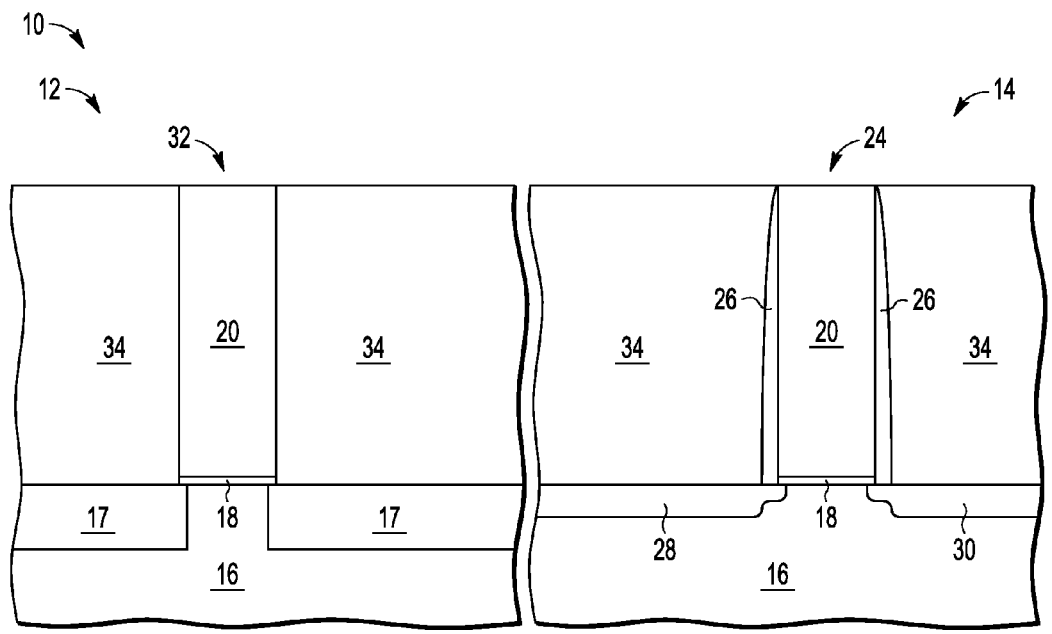
FIG. 5 is a cross section of a non-volatile memory cell and a replacement gate transistor of FIG. 3 at a subsequent stage in processing.

Shown in FIG. 5 is semiconductor device 10 after forming an interlayer dielectric (ILD) 34 on the sides of charge storage layer 20 in NVM portion 12 and around sidewall spacer 26 and thus around dummy gate 24 in logic portion 14. ILD 34 may be a stack of materials or a single material such as tetraethylortho silicate (TEOS).

Figure 6:
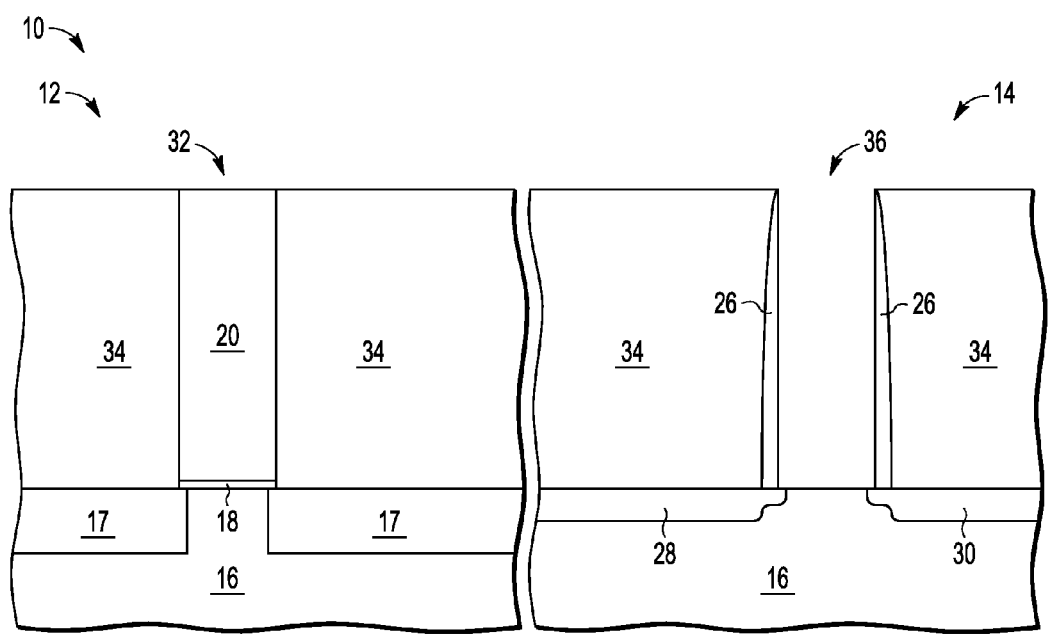
FIG. 6 is a cross section of a non-volatile memory cell and a replacement gate transistor of FIG. 3 at a subsequent stage in processing.

Shown in FIG. 6 is semiconductor device 10 after removing dummy gate 24 and underlying dielectric 18 to leave opening 36 where dummy gate 24 had been before being removed while NVM portion 12 is masked. For the case where dummy gate 24 is polysilicon and ILD 34 is oxide, no patterned mask may be needed in logic portion 14 to selectively remove dummy gate 24. If dummy gate 24 is nitride, then it may also be that no mask is needed to selectively remove dummy gate 24.

Figure 7:
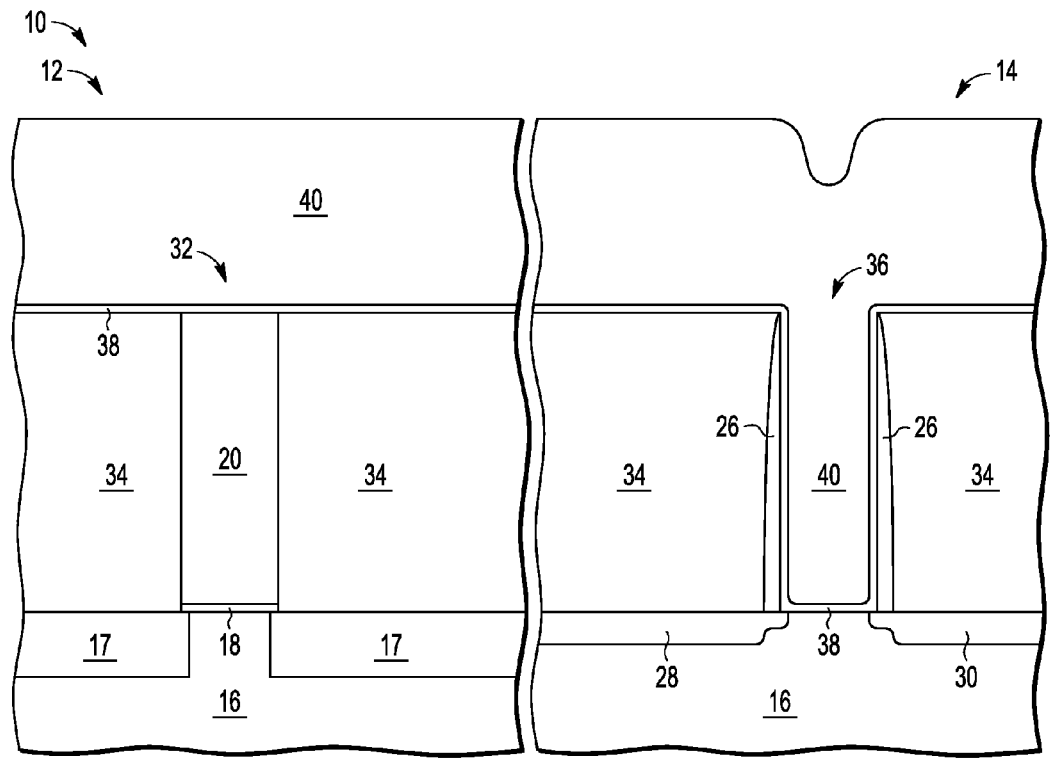
FIG. 7 is a cross section of a non-volatile memory cell and a replacement gate transistor of FIG. 6 at a subsequent stage in processing.

Shown in FIG. 7 is semiconductor device 10 after depositing high-k gate dielectric 38 in opening 36, over ILD 34, and over charge storage structure 32, and depositing a metal layer 40 over high-k gate dielectric 38. High-k gate dielectric 38 may, for example, comprise materials such as hafnium oxide, lanthanum oxide, or aluminum oxide. Metal layer 40 may be a stack of different conductive layers including one or more metal layers. For example, metal layer 40 may be a stack of polysilicon and titanium nitride or polysilicon and tantalum nitride.

Figure 8:
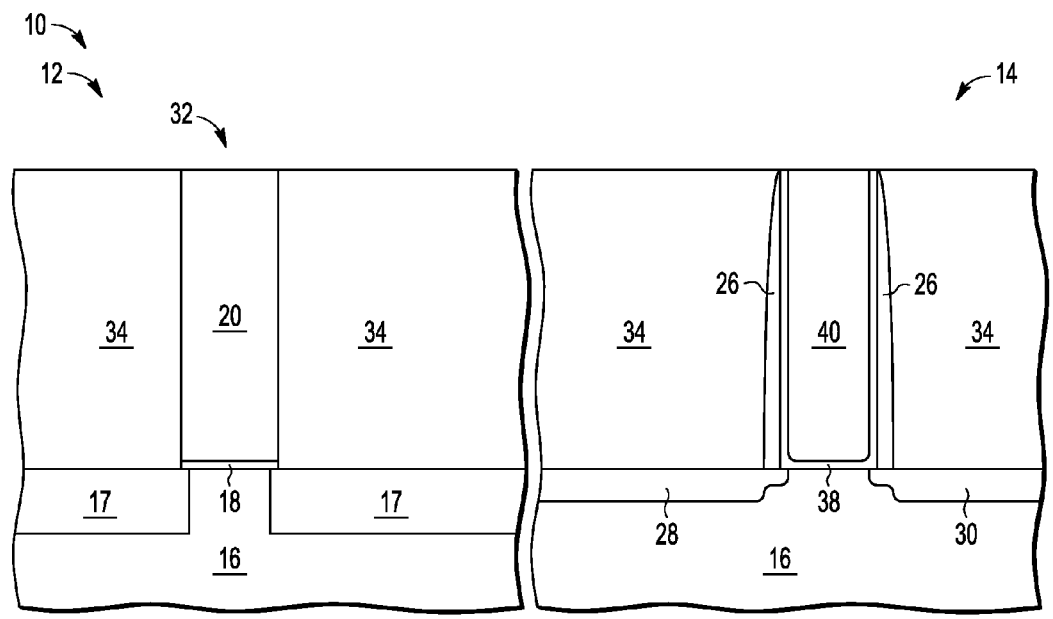
FIG. 8 is a cross section of a non-volatile memory cell and a replacement gate transistor of FIG. 7 at a subsequent stage in processing.

Shown in FIG. 8 is semiconductor device 10 after performing a step of chemical mechanical polishing that results in a planar surface in both NVM portion 12 and logic portion 14 to result in a logic gate 40 in opening 36 in which high-k gate dielectric 38 functions as a gate dielectric between logic gate 40 and substrate 16 in logic portion 14. FIGS. 6-8 show a replacement gate process.

Figure 9:
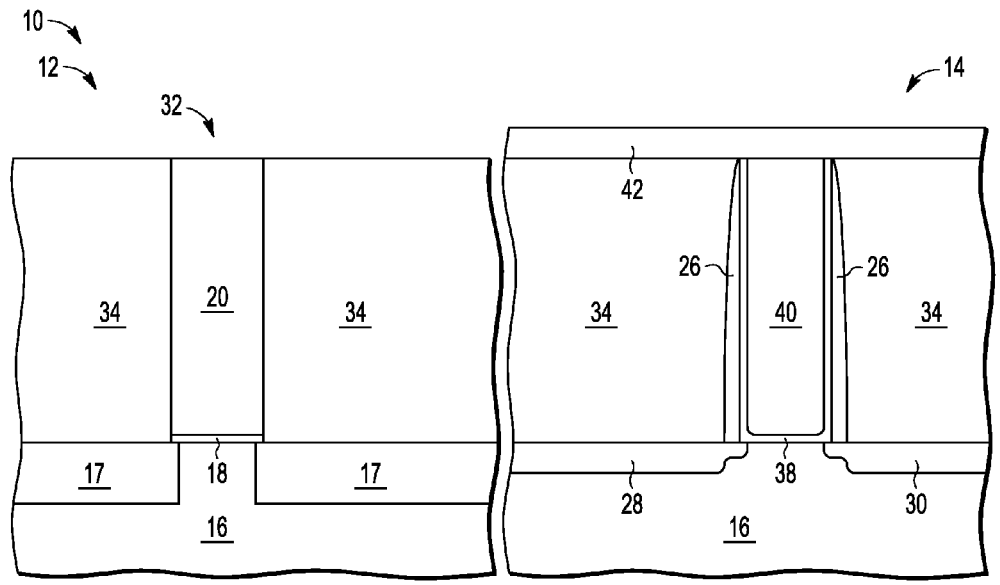
FIG. 9 is a cross section of a non-volatile memory cell and a replacement gate transistor of FIG. 8 at a subsequent stage in processing.

Shown in FIG. 9 is semiconductor device 10 after forming a hard mask 42, which may be nitride, over logic portion 14 and leaving NVM portion 12 exposed as it was in FIG. 8.

Figure 10:
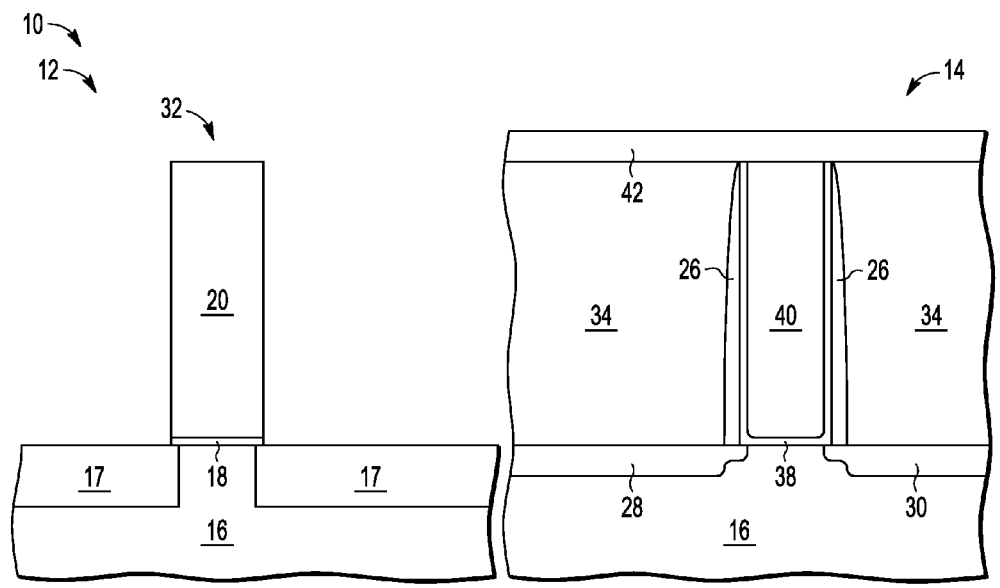
FIG. 10 is a cross section of a non-volatile memory cell and a replacement gate transistor of FIG. 9 at a subsequent stage in processing.

Shown in FIG. 10 is semiconductor device 10 after removing ILD 34 in NVM portion 12 while leaving ILD 34 in logic portion 14. This leaves charge storage structure 32 in NVM portion 12.

Figure 11:
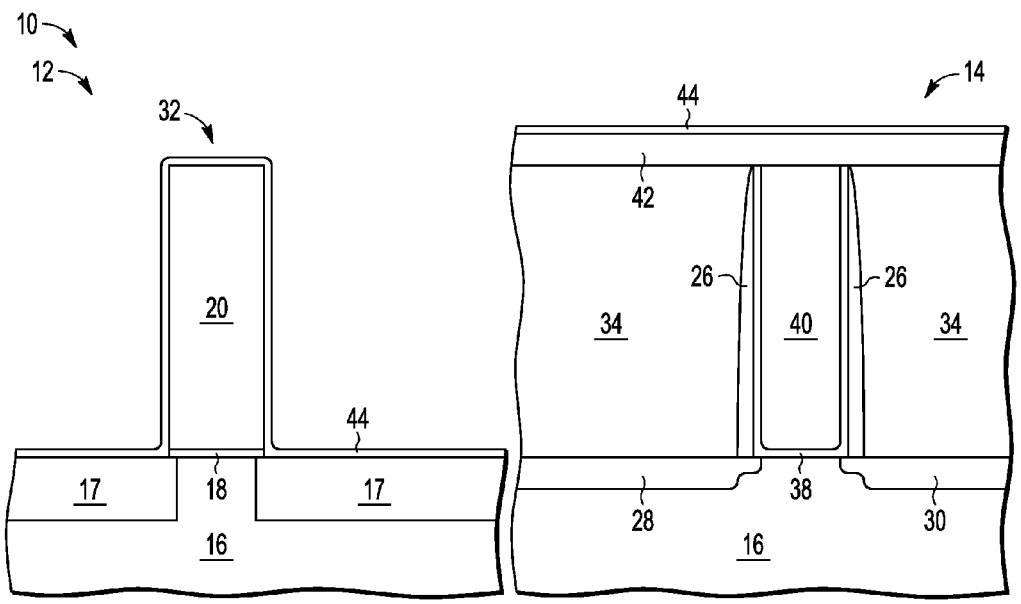
FIG. 11 is a cross section of a non-volatile memory cell and a replacement gate transistor of FIG. 10 at a subsequent stage in processing.

Shown in FIG. 11 is semiconductor device 10 after forming dielectric layer 44 on charge storage layer 20 and dielectric layer 17 in NVM portion 12 and over hard mask 42 in logic portion 14. Dielectric layer 44 is chosen for providing the desired coupling between a control gate to subsequently be formed on dielectric layer 44 and charge storage structure 32. For the case of charge storage layer 20 being polysilicon, dielectric layer 44 may be a stack of oxide, nitride, and oxide (ONO) or some variation such as oxynitride and oxide or some other combination using a high-k dielectric (H) with nitride such as ONH or HNH. For the case of charge storage layer 20 being nitride, dielectric layer 44 may simply be a high-k dielectric.

Figure 12:
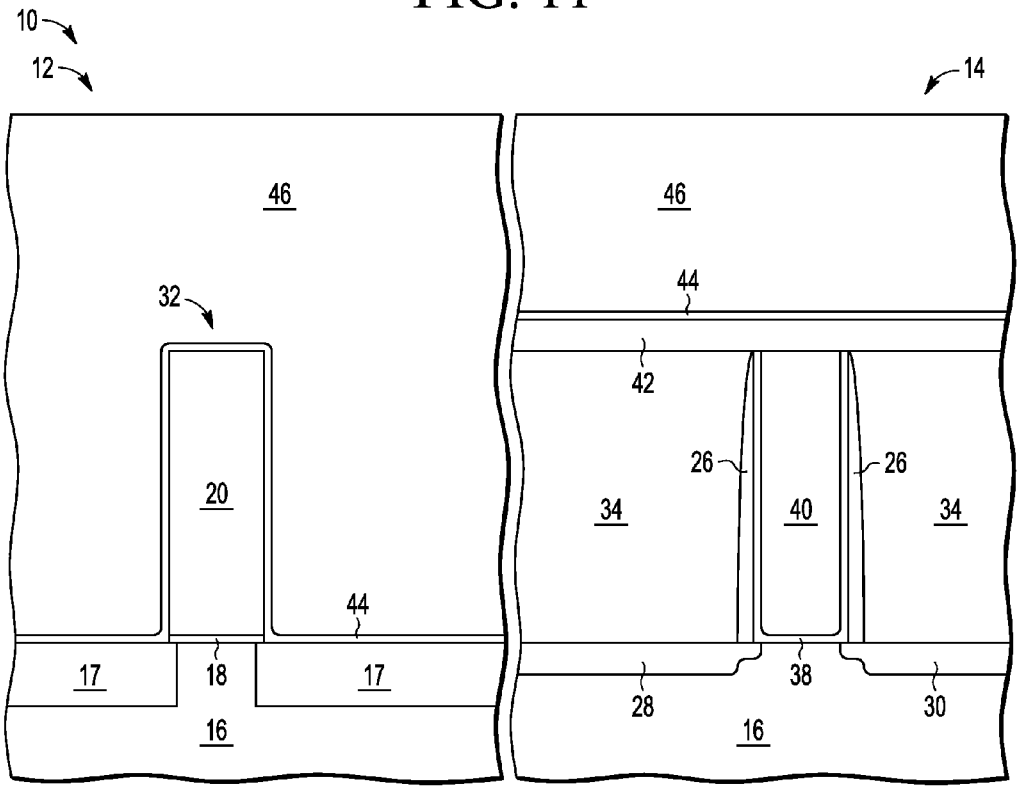
FIG. 12 is a cross section of a non-volatile memory cell and a replacement gate transistor of FIG. 11 at a subsequent stage in processing.

Shown in FIG. 12 is semiconductor device 10 after forming a conductive layer 46 over dielectric layer 44 in both logic portion 14 and NVM portion 12. Conductive layer 46 may be similar in composition to metal layer 40 and can be a stack of different conductive layers.

Figure 13:
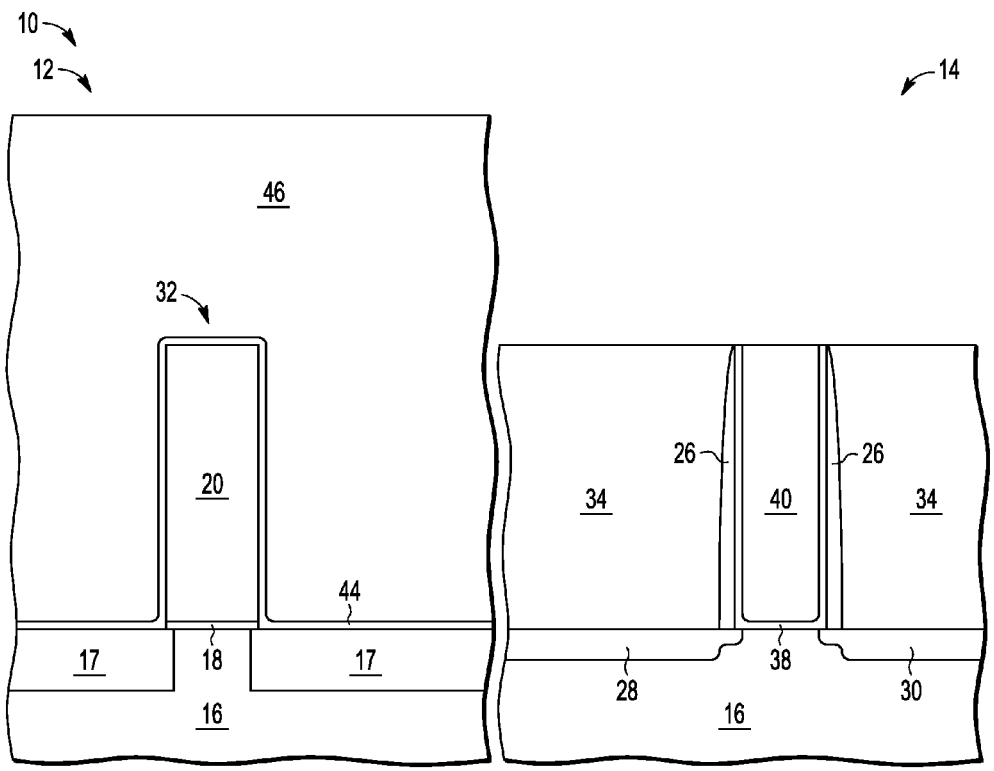
FIG. 13 is a cross section of a non-volatile memory cell and a replacement gate transistor of FIG. 12 at a subsequent stage in processing.

Shown in FIG. 13 is semiconductor device 10 after etching conductive layer 46 so as to remove it from logic portion 14 and to pattern conductive layer 46 so as to form word lines. Aligned to that word line-forming etch is an etch of dielectric layer 44 and charge storage layer 20 so that charge storage structure 32 is no longer continuous in the bit line direction but rather is formed into charge storage bits, one for each cell.

Thus, it is seen that the resulting word line formed from conductive layer 46 is not just on the top of charge storage structure 32 but also along the sides of charge storage layer 20 in an efficient manner in the context of integrating with construction of replacement gate logic transistors.

Figure 14:
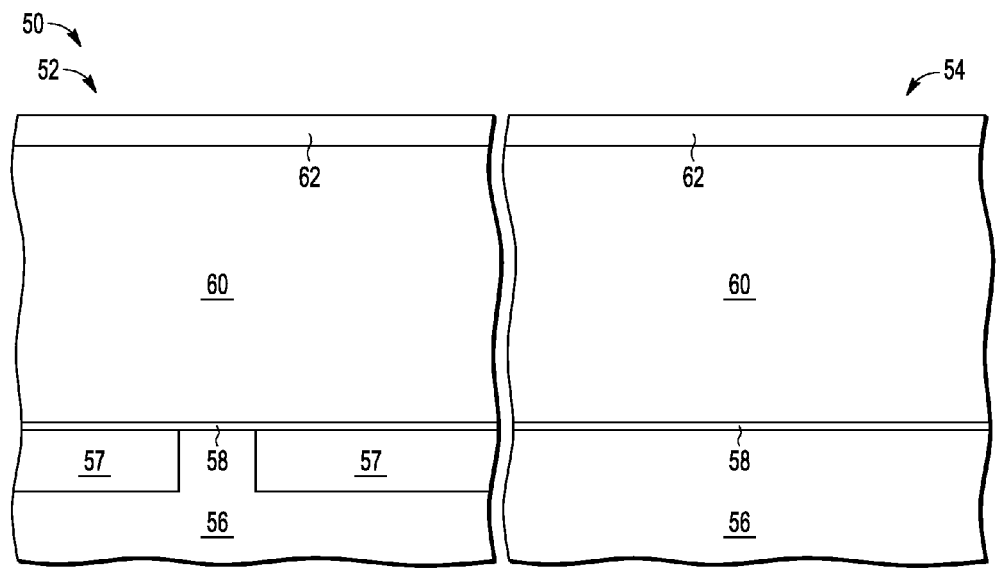
FIG. 14 is a cross section of a non-volatile memory cell and a replacement gate transistor at a stage in processing according to a second embodiment.

Shown in FIG. 14 is a semiconductor device 50 substantially the same as semiconductor device 10 of FIG. 1. Semiconductor device 50 has a non-volatile memory (NVM) portion 52 and a logic portion 54 formed over a semiconductor substrate 56. In NVM portion 52 is a dielectric layer 57 that functions as an isolation region and is of an appropriate depth for that purpose. Substrate 56 has a portion between regions of dielectric layer 57 that defines an active region useful in forming an NVM cell. Over substrate 56 in both the NVM and logic portions is a dielectric layer 58 that is useful as a gate dielectric for an NVM cell. Dielectric layer 58 may be a high-k dielectric or other dielectric, such as thermally grown oxide for example, that may be used as a tunnel dielectric. A charge storage layer 60 is over dielectric 58. Charge storage layer 60 may be polysilicon or some other material useful as a floating gate. Another possibility is that charge storage layer 60 could be nitride. The primary example explained herein is for charge storage layer 60 being polysilicon. If nitride is chosen, then some variations in other layers will be required for the needed selective etching. A hard mask layer 62 is over charge storage layer 60. Hard mask layer 62 may be nitride if charge storage layer 60 is polysilicon and oxide if charge storage layer 60 is nitride.

Figure 15:
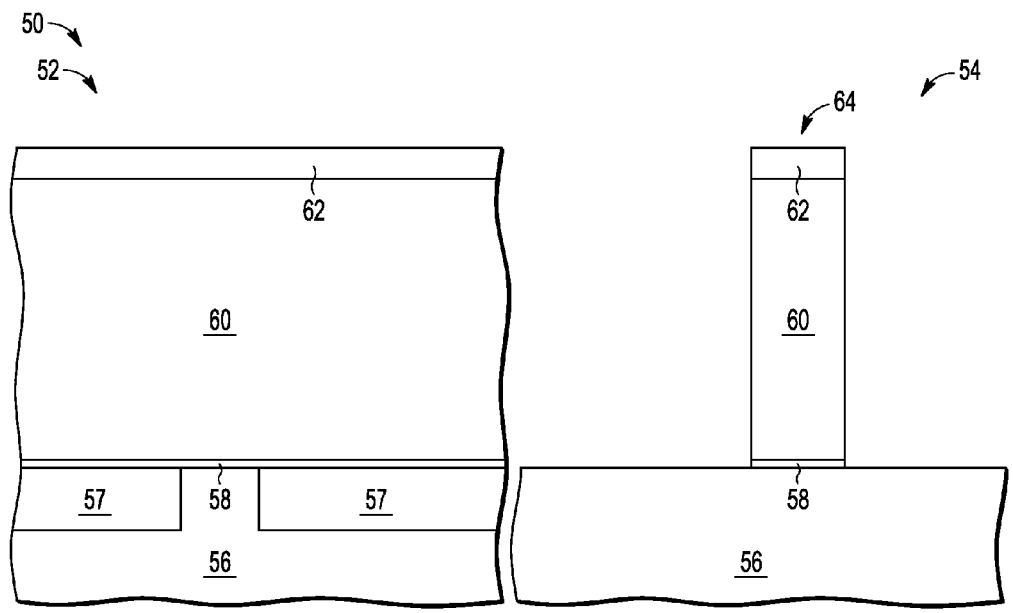
FIG. 15 is a cross section of the non-volatile memory cell and a replacement gate transistor of FIG. 14 at a subsequent stage in processing.

Shown in FIG. 15 is semiconductor device 50 after etching charge storage layer 60 into a dummy gate 64 in logic portion 54 very similar to semiconductor device 10 of FIG. 2. NVM portion 52 is masked during the formation of dummy gate 64. Hard mask 62 is useful in providing protection for etching through charge storage layer 60. Dummy gate 64 will be replaced by a logic gate in subsequent processing.

Figure 16:
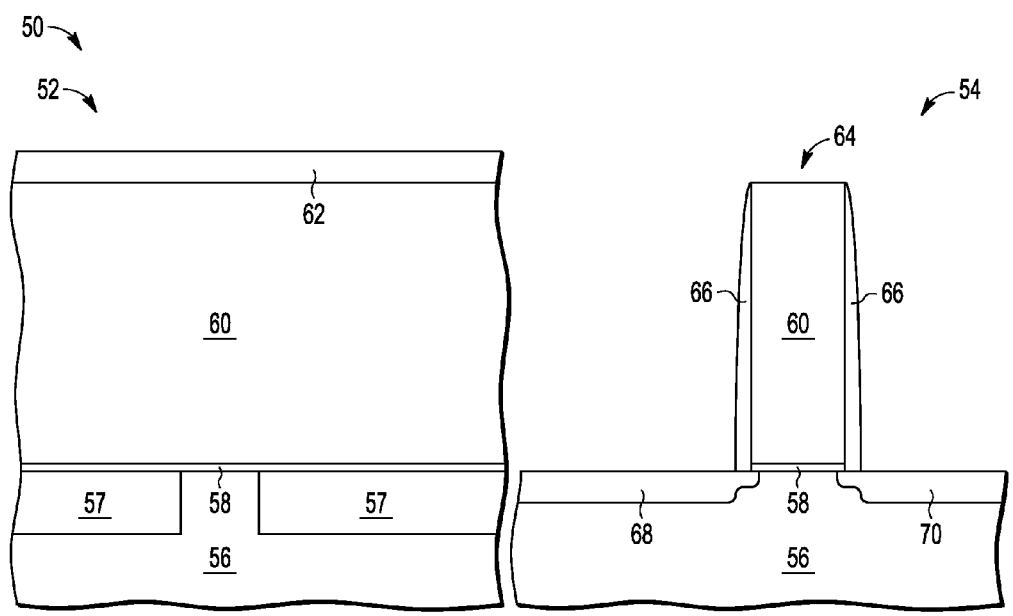
FIG. 16 is a cross section of the non-volatile memory cell and a replacement gate transistor of FIG. 15 at a subsequent stage in processing.

Shown in FIG. 16 is semiconductor device 50 after forming, in logic portion 54, a sidewall spacer 66 around dummy gate 64, a source/drain region 68 in substrate 56 on a first side of dummy gate 64, and a source/drain region 70 on a second side of dummy gate 64. This is very similar to semiconductor device 10 of FIG. 3. The portion of hard mask 62 over dummy gate 64 may be removed during this sequence of steps, or subsequently during a chemical mechanical polishing (CMP) step as part of FIG. 18 below.

Figure 17:
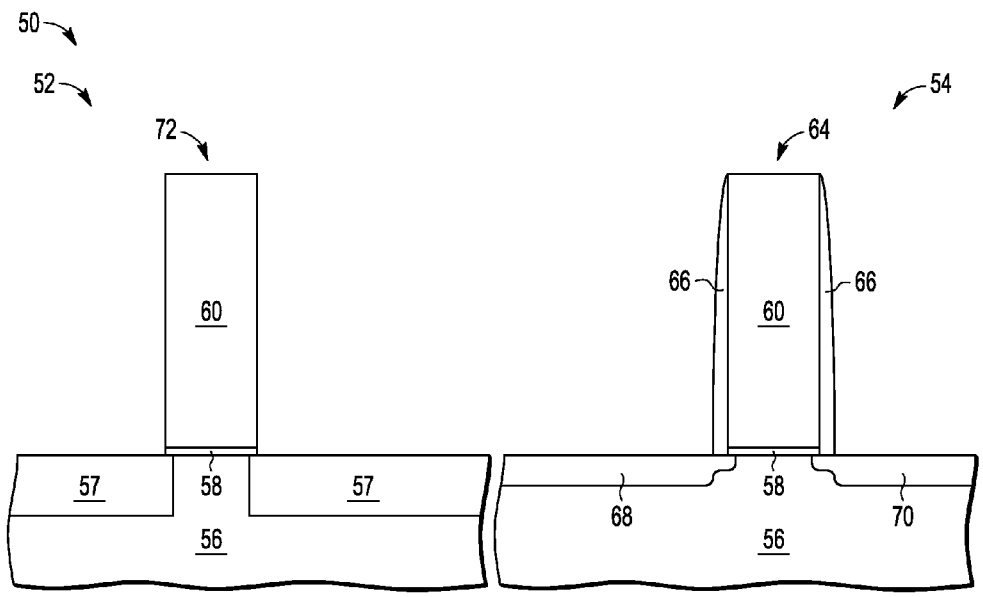
FIG. 17 is a cross section of the non-volatile memory cell and a replacement gate transistor of FIG. 16 at a subsequent stage in processing.

Shown in FIG. 17 is semiconductor device 50 after pattern etching charge storage layer 60 to form a charge storage structure 72 very similar to semiconductor device 10 of FIG. 4. Two sides of charge storage structure 72 are shown in FIG. 17. Both of these sides shown in FIG. 17 extend over dielectric layer 57. This etch results in charge storage structure 72 running in a bit line direction of an NVM array having a plurality of NVM cells of which one NVM cell will be finished in NVM portion 52 shown in FIG. 17.

Figure 18:
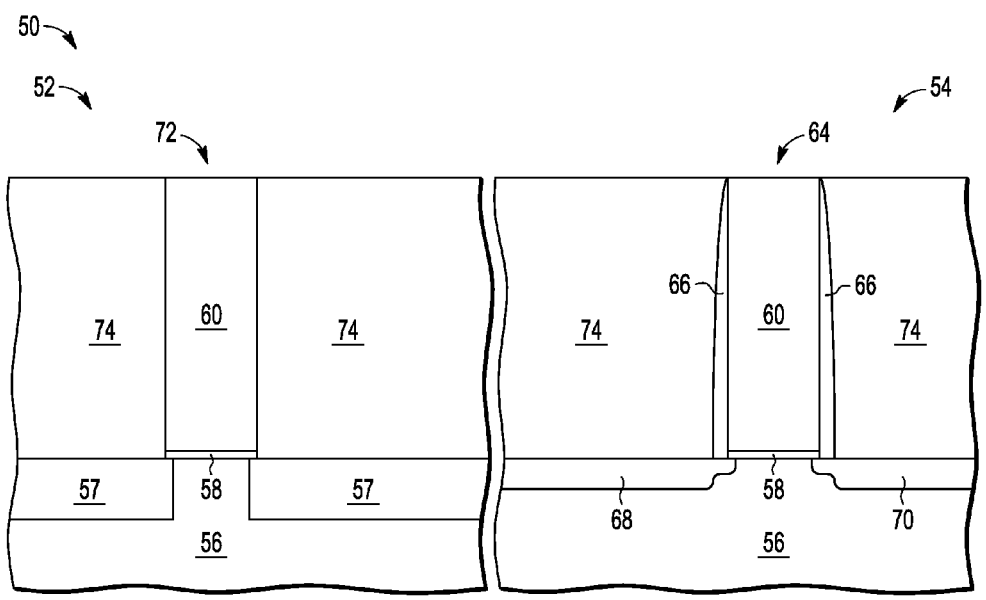
FIG. 18 is a cross section of the non-volatile memory cell and a replacement gate transistor of FIG. 17 at a subsequent stage in processing.

Shown in FIG. 18 is semiconductor device 50 after forming an interlayer dielectric (ILD) 74 on the sides of charge storage layer 60 in NVM portion 52 and around sidewall spacer 66 and thus around dummy gate 64 in logic portion 54.

Figure 19:
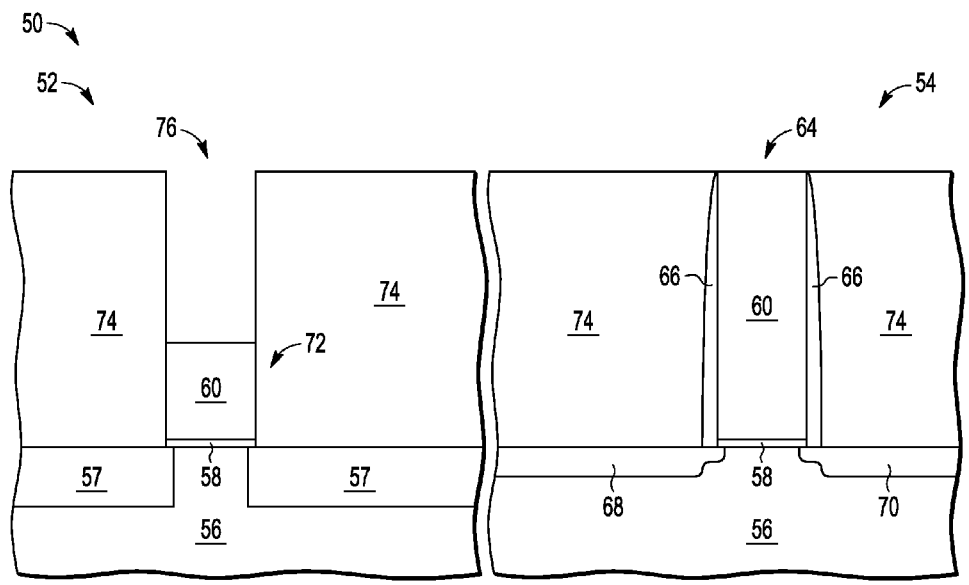
FIG. 19 is a cross section of the non-volatile memory cell and a replacement gate transistor of FIG. 18 at a subsequent stage in processing.

Shown in FIG. 19 is semiconductor device 50 after an etch back of charge storage layer 60 in NVM portion 52 while logic portion 54 is masked. Either nitride or polysilicon can be etched selectively to oxide so no mask is required on NVM portion 52 to achieve the etch back of just charge storage layer 60 in NVM portion 52. The etch back leaves an opening 76 above the remaining portion of charge storage layer 60 in FIG. 19. As alternative approach for forming the reduced height of charge storage layer 60 as shown in FIG. 19, the deposition of charge storage layer 60 in FIG. 14 could be replaced by an initial charge storage deposition of the desired height followed by an etch stop layer and a fill material over the etch stop layer. The fill material could be polysilicon and the etch stop layer could be nitride.

Figure 20:
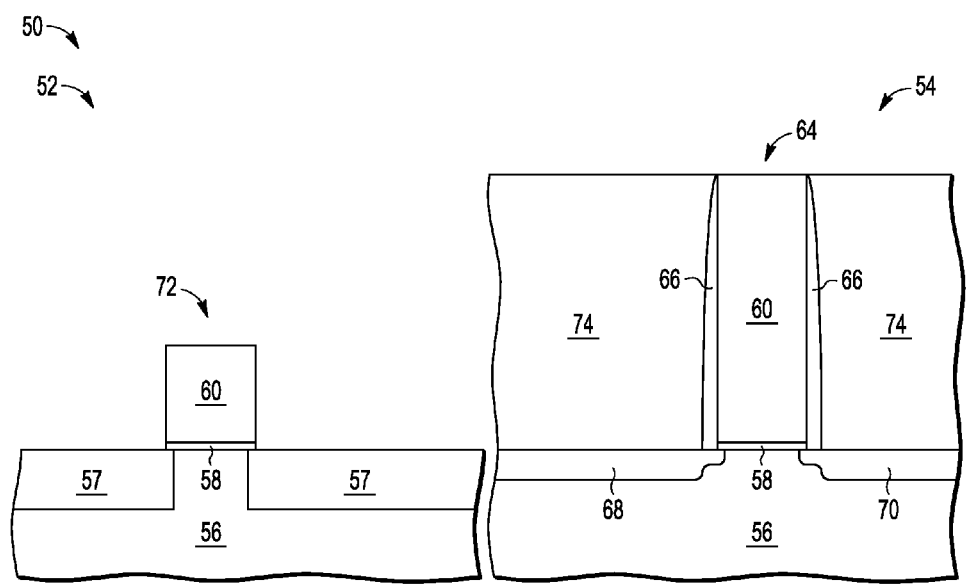
FIG. 20 is a cross section of the non-volatile memory cell and a replacement gate transistor of FIG. 19 at a subsequent stage in processing.

Shown in FIG. 20 is semiconductor device 50 after removing ILD 74 in NVM portion 52 showing charge storage structure 72. This shows two sides of charge storage structure 72 that run in the bit line direction and are exposed. Logic portion 54 is masked and an etchant that removes oxide and that is selective to polysilicon in the case of charge storage layer 60 being polysilicon is applied without requiring a mask over NVM portion 52. If charge storage layer 60 is nitride, then an etchant that etches oxide selectively to nitride is used.

Figure 21:
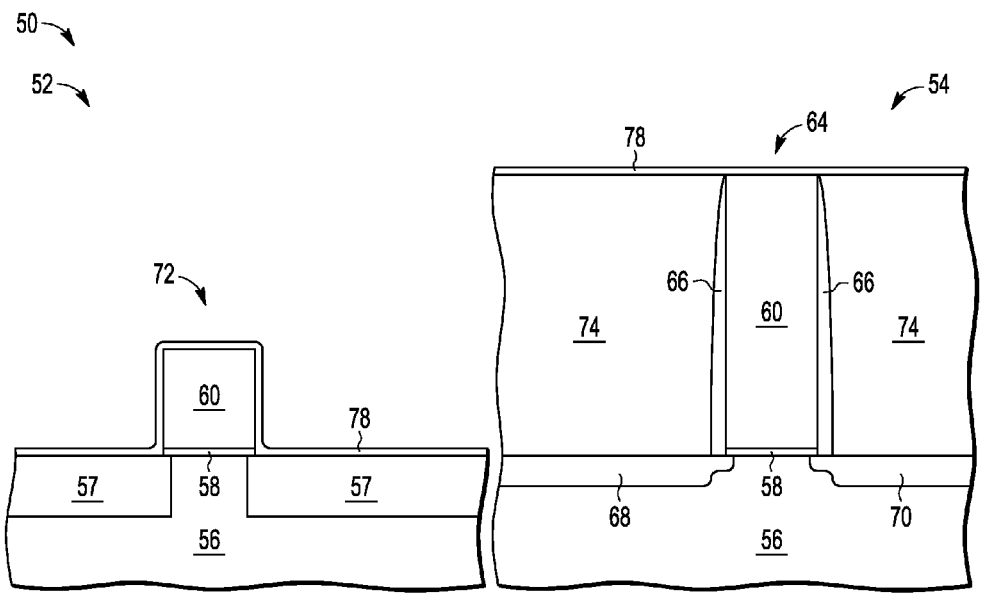
FIG. 21 is a cross section of the non-volatile memory cell and a replacement gate transistor of FIG. 20 at a subsequent stage in processing.

Shown in FIG. 21 is semiconductor device 50 after depositing a dielectric layer 78 on the top and two sides shown in FIG. 21 of charge storage structure 72 and dielectric layer 57 of NVM portion 52 and on ILD 74 and dummy gate 64 of logic portion 54. Dielectric layer 78 is a portion of the final dielectric layer that will be on charge storage layer 60 and in contact with the control gate to be formed. Dielectric layer 78 is chosen to be combined with a high-k dielectric layer useful as a gate dielectric for providing an optimum capacitor between charge storage layer 60 and the control gate to be formed. For example, dielectric layer 78 may be an oxide/nitride stack on which will be subsequently deposited a high-k dielectric. In such case the different thicknesses of the oxide and nitride will be chosen so that when combined with the high-k dielectric they will result in the optimum combination of breakdown voltage, leakage, and capacitance. The possibility exists that dielectric layer 78 will not be needed and only the high-k dielectric layer will be needed.

Figure 22:
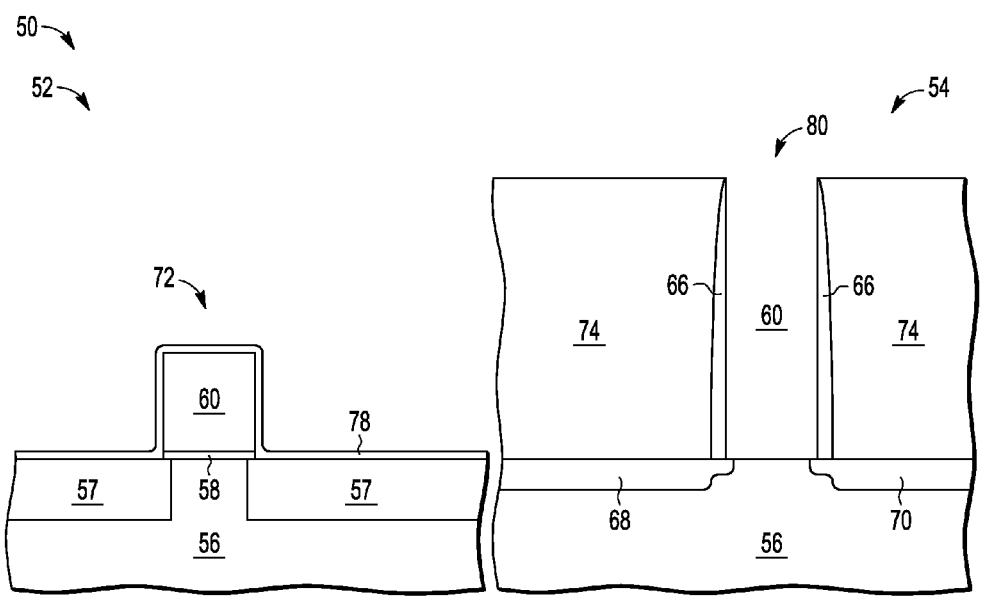
FIG. 22 is a cross section of the non-volatile memory cell and a replacement gate transistor of FIG. 21 at a subsequent stage in processing.

Shown in FIG. 22 is semiconductor device 50 after removing dummy gate 64 and leaving an opening 80 in logic portion 54. This exposes the substrate 56 at the bottom of opening 80. NVM portion 52 is masked during this removal of dummy gate 64. No mask is required on logic portion 54 because an etchant that etches charge storage layer 60 can be found that is selective to ILD 74.

Figure 23:
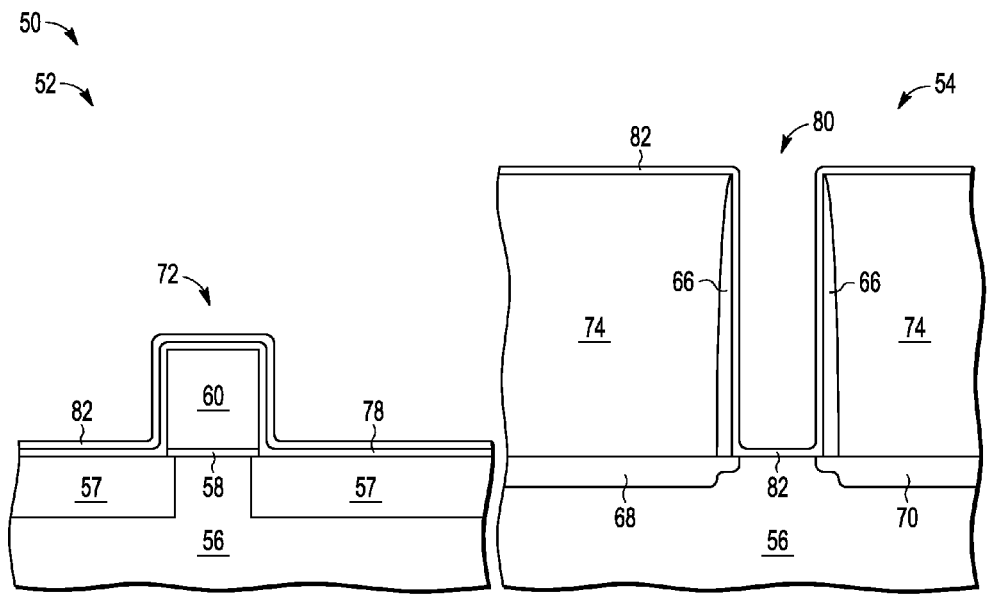
FIG. 23 is a cross section of the non-volatile memory cell and a replacement gate transistor of FIG. 22 at a subsequent stage in processing.

Shown in FIG. 23 is semiconductor device 50 after depositing a high-k dielectric 82 in opening 80 and on ILD 74 in logic portion 54 and on dielectric layer 78 in NVM portion 52. This completes the dielectric that will be between charge storage layer 60 and the control gate. High-k dielectric 82 is on the sidewalls of opening 80 which is sidewall spacer 66 and on the bottom of opening 80 which is substrate 56.

Figure 24:
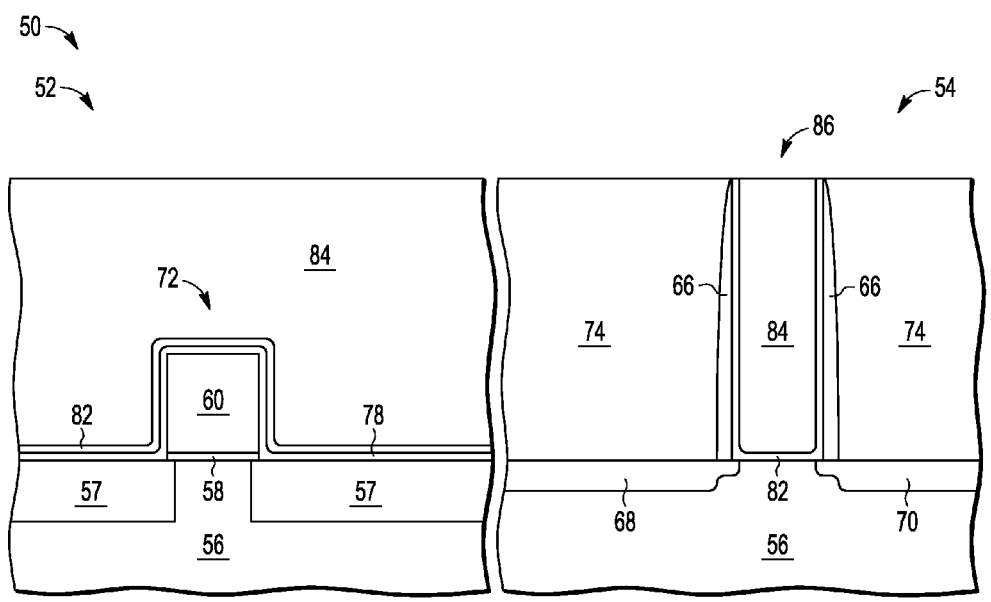
FIG. 24 is a cross section of the non-volatile memory cell and a replacement gate transistor of FIG. 23 at a subsequent stage in processing.

Shown in FIG. 24 is semiconductor device 50 after depositing a metal layer 84 and performing a step of chemical mechanical polishing. The result is that metal layer 84 in NVM portion 52 is on high-k dielectric 82, metal layer 84 has filled opening 80 to result in a logic gate 86, and logic gate 86 is the same height as metal layer 84 in NVM portion 52. Being of the same height is a desirable result for ease of subsequent processing. After the deposition of metal layer 84 as shown in FIG. 24, an etch to form metal layer 84 into word lines is used to provide self-alignment to the edge of charge storage layer 60 that runs in the bit line direction to result in charge storage bits; one per NVM cell. FIGS. 22-24 show a replacement gate process.

Figure 25:
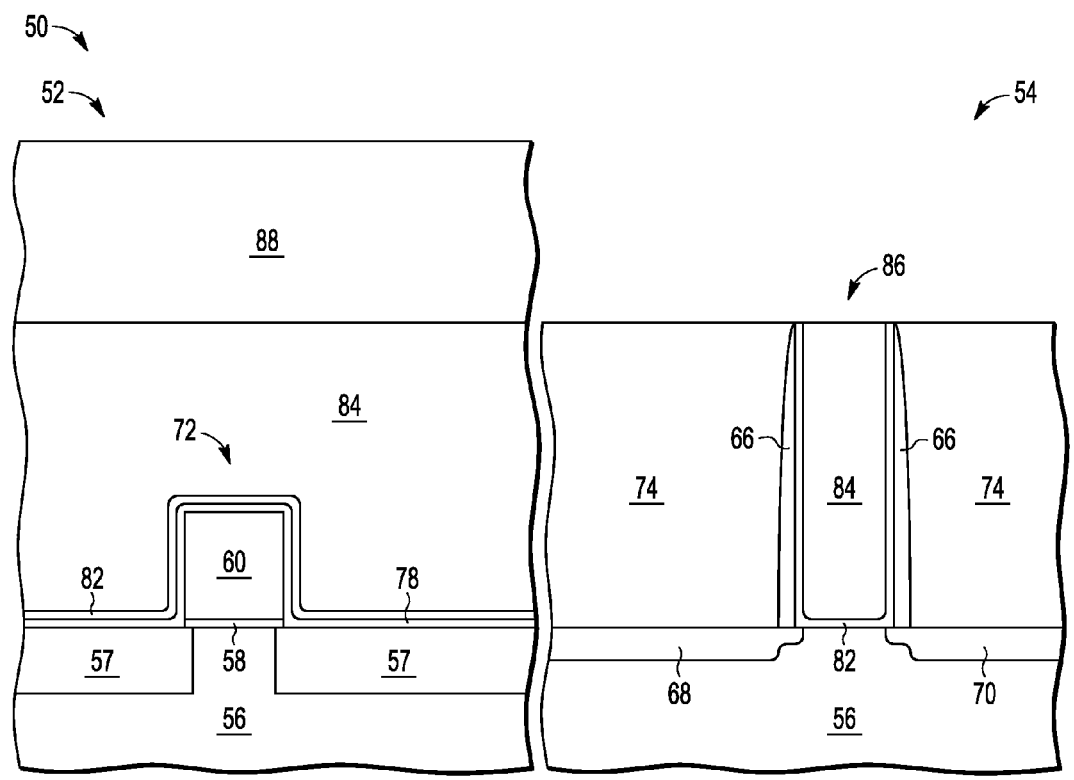
FIG. 25 is a cross section of the non-volatile memory cell and a replacement gate transistor of FIG. 24 at a subsequent stage in processing.

Shown in FIG. 25 is an additional step that can be taken if necessary to increase the conductivity of the word line by adding a metal layer 88 on metal layer 84. This can be achieved by forming a hard mask on logic portion 54, depositing metal layer 88, removing metal layer 88 in logic portion 54, and then removing the hard mask in logic portion 54.

Thus it is seen that an integration can result in efficiently providing a high-k dielectric for both the gate dielectric of a logic transistor and the charge storage layer to control the gate dielectric of an NVM cell.

By now it should be appreciated that there has been provided a method for forming a semiconductor device having a non-volatile memory (NVM) region and a logic region. The method includes forming a first dielectric layer over a semiconductor layer in the NVM region and the logic region. The method includes forming a charge storage layer over the first dielectric layer in the NVM region and the logic region. The method includes patterning the charge storage layer to form a dummy gate in the logic region. The method includes patterning the charge storage layer to form a charge storage structure in the NVM region. The method includes forming a second dielectric layer over the semiconductor layer in the NVM region and the logic region, wherein the second dielectric layer surrounds the charge storage structure in the NVM region and the dummy gate in the logic region. The method includes removing the second dielectric layer from the NVM region while protecting the second dielectric layer in the logic region. The method includes removing the dummy gate in the logic region which results in an opening in the logic region.

The method includes forming a third dielectric layer over the semiconductor layer and charge storage structure in the NVM region and over the second dielectric layer and within the opening in the logic region. The method includes forming a gate layer over the third dielectric layer in the NVM region and within the opening in the logic region, wherein the gate layer forms a control gate layer in the NVM region and the gate layer within the opening in the logic region forms a logic gate. The method may have a further characterization by which the step of forming the second dielectric layer is performed such that a top surface of the second dielectric layer is substantially coplanar with top surfaces of the charge storage structure and the dummy gate. The method may further include after the step of forming the second dielectric layer and prior to the step of forming the third dielectric layer, removing a portion of the charge storage structure such that the top surface of the charge storage structure is recessed from the top surface of the second dielectric layer. The method may have a further characterization by which the step of forming the second dielectric layer forming the second dielectric layer over the semiconductor layer, the charge storage structure, and the dummy gate and planarizing the second dielectric layer to expose the charge storage structure and the dummy gate. The method may have a further characterization by which the step of forming the third dielectric layer is performed such that the third dielectric layer is in contact with the semiconductor layer within the opening in the logic region. The method may further include after the step of removing the second dielectric layer from the NVM region and prior to the step of removing the dummy gate, forming a fourth dielectric layer over the semiconductor layer and the charge storage structure in the NVM region, wherein the third dielectric layer is formed over the fourth dielectric layer in the NVM region. The method may have a further characterization by which the fourth dielectric layer comprises a plurality of layers, each of the plurality of layers comprises a material selected from the group consisting of a nitride, an oxide, and an oxynitride. The method may have a further characterization by which the step of forming the fourth dielectric layer is performed such that it is also formed over the second dielectric layer and dummy gate in the logic region. The method may have a further characterization by which the charge storage structure comprises polysilicon. The method may have a further characterization by which the third dielectric layer comprises a dielectric material having a high dielectric constant. The method may further include forming a sidewall spacer adjacent a sidewall of the dummy gate and forming source/drain regions in the semiconductor layer adjacent the dummy gate. The method may have a further characterization by which the charge storage structure comprises a material selected from the group consisting of polysilicon and nitride.

The method may further include patterning the control gate layer, the third dielectric layer, and the charge storage structure in the NVM region to form a NVM cell in the NVM region.

Described also is a method for forming a semiconductor device having a non-volatile memory (NVM) region and a logic region. The method includes forming a first dielectric layer over a semiconductor layer in the NVM region and the logic region. The method further includes forming a charge storage layer over the first dielectric layer in the NVM region and the logic region. The method further includes patterning the charge storage layer to form a dummy gate in the logic region. The method further includes patterning the charge storage layer to form a charge storage structure in the NVM region. The method further includes forming a second dielectric layer over the semiconductor layer in the NVM region and the logic region, wherein the second dielectric layer surrounds the charge storage structure in the NVM region and the dummy gate in the logic region, and wherein a top surface of the second dielectric layer is substantially coplanar with top surfaces of the charge storage structure and the dummy gate. The method further includes removing a portion of the charge storage structure such that the top surface of the charge storage structure is recessed from the top surface of the second dielectric layer. The method further includes after the step of removing the portion of the charge storage structure, removing the second dielectric layer from the NVM region while protecting the second dielectric layer in the logic region. The method further includes removing the dummy gate in the logic region which results in an opening in the logic region. The method further includes forming a third dielectric layer over the semiconductor layer and the charge storage structure in the NVM region and over the second dielectric layer and within the opening in the logic region, wherein the third dielectric layer is in contact with the semiconductor layer within the opening. The method further includes forming a gate layer over the third dielectric layer in the NVM region and within the opening in the logic region, wherein the gate layer forms a control gate layer in the NVM region and the gate layer within the opening in the logic region forms a logic gate. The method may further include after the step of removing the second dielectric layer from the NVM region and prior to the step of removing the dummy gate, forming a fourth dielectric layer over the semiconductor layer and the charge storage structure in the NVM region, wherein the third dielectric layer is formed over the fourth dielectric layer in the NVM region. The method may have a further characterization by which the fourth dielectric layer comprises a plurality of layers, each of the plurality of layers comprises a material selected from the group consisting of a nitride, an oxide, and an oxynitride. The method may have a further characterization by which the third dielectric layer comprises a dielectric material having a high dielectric constant. The method may have a further characterization by which the charge storage structure comprises a material selected from the group consisting of polysilicon and nitride. The method may further include forming a control gate extension layer over the control gate layer in the NVM region.

Also described is a method for forming a semiconductor device having a non-volatile memory (NVM) region and a logic region. The method includes forming a first dielectric layer over a semiconductor layer in the NVM region and the logic region. The method further includes forming a charge storage layer over the first dielectric layer in the NVM region and the logic region. The method further includes patterning the charge storage layer to form a dummy gate in the logic region. The method further includes patterning the charge storage layer to form a charge storage structure in the NVM region. The method further includes forming a second dielectric layer over the semiconductor layer in the NVM region and the logic region, wherein the second dielectric layer surrounds the charge storage structure in the NVM region and the dummy gate in the logic region, and wherein a top surface of the second dielectric layer is substantially coplanar with top surfaces of the charge storage structure and the dummy gate. The method further includes removing a portion of the charge storage structure such that the top surface of the charge storage structure is recessed from the top surface of the second dielectric layer. The method further includes after the step of removing the portion of the charge storage structure, removing the second dielectric layer from the NVM region while protecting the second dielectric layer in the logic region. The method further includes forming a third dielectric layer over the semiconductor layer and the charge storage structure in the NVM region and over the second dielectric layer and the dummy gate in the logic region. The method further includes removing the dummy gate in the logic region which results in an opening in the logic region. The method further includes forming a fourth dielectric layer over the third dielectric layer in the NVM region and over the second dielectric layer and within the opening in the logic region, wherein the fourth dielectric layer is in contact with the semiconductor layer within the opening. The method further includes forming a gate layer over the fourth dielectric layer in the NVM region and within the opening in the logic region, wherein the gate layer forms a control gate layer in the NVM region and the gate layer within the opening in the logic region forms a logic gate.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, materials were specified in some cases, but that other materials may be used also. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim 1ncludes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor device having a non-volatile memory (NVM) region and a logic region, the method comprising:
    forming a first dielectric layer over a semiconductor layer in the NVM region and the logic region;
    forming a charge storage layer over the first dielectric layer in the NVM region and the logic region;
    patterning the charge storage layer to form a dummy gate in the logic region;
    patterning the charge storage layer to form a charge storage structure in the NVM region;
    forming a second dielectric layer over the semiconductor layer in the NVM region and the logic region, wherein the second dielectric layer surrounds the charge storage structure in the NVM region and the dummy gate in the logic region;
    removing the second dielectric layer from the NVM region while protecting the second dielectric layer in the logic region;
    removing the dummy gate in the logic region which results in an opening in the logic region;
    forming a third dielectric layer over the semiconductor layer, the charge storage structure in the NVM region, and the second dielectric layer, within the opening in the logic region, and along sidewalls of the charge storage structure; and
    forming a gate layer over the third dielectric layer in the NVM region and within the opening in the logic region, wherein the gate layer forms a control gate layer in the NVM region that is over and along the sidewalls of the charge storage structure and wherein the gate layer within the opening in the logic region forms a logic gate.

2. The method of claim 1, wherein the step of forming the second dielectric layer is performed such that a top surface of the second dielectric layer is substantially coplanar with top surfaces of the charge storage structure and the dummy gate.

3. The method of claim 2, further comprising:
    after the step of forming the second dielectric layer and prior to the step of forming the third dielectric layer, removing a portion of the charge storage structure such that the top surface of the charge storage structure is recessed from the top surface of the second dielectric layer.

4. The method of claim 2, wherein the step of forming the second dielectric layer comprises:
    forming the second dielectric layer over the semiconductor layer, the charge storage structure, and the dummy gate; and
    planarizing the second dielectric layer to expose the charge storage structure and the dummy gate.

5. The method of claim 1, wherein the step of forming the third dielectric layer is performed such that the third dielectric layer is in contact with the semiconductor layer within the opening in the logic region.

6. The method of claim 1, further comprising:
    after the step of removing the second dielectric layer from the NVM region and prior to the step of removing the dummy gate, forming a fourth dielectric layer over the semiconductor layer and the charge storage structure in the NVM region, wherein the third dielectric layer is formed over the fourth dielectric layer in the NVM region.

7. The method of claim 6, wherein the fourth dielectric layer comprises a plurality of layers, each of the plurality of layers comprises a material selected from the group consisting of a nitride, an oxide, and an oxynitride.

8. The method of claim 6, wherein the step of forming the fourth dielectric layer is performed such that it is also formed over the second dielectric layer and dummy gate in the logic region.

9. The method of claim 6, wherein the charge storage structure comprises polysilicon.

10. The method of claim 1, wherein the third dielectric layer comprises a dielectric material having a high dielectric constant.

11. The method of claim 1, further comprising:
forming a sidewall spacer adjacent a sidewall of the dummy gate; and
forming source/drain regions in the semiconductor layer adjacent the dummy gate.

12. The method of claim 1, wherein the charge storage structure comprises a material selected from the group consisting of polysilicon and nitride.

13. The method of claim 1, further comprising:
patterning the control gate layer, the third dielectric layer, and the charge storage structure in the NVM region to form a NVM cell in the NVM region.

14. A method for forming a semiconductor device having a non-volatile memory (NVM) region and a logic region, the method comprising:
forming a first dielectric layer over a semiconductor layer in the NVM region and the logic region;
forming a charge storage layer over the first dielectric layer in the NVM region and the logic region;
patterning the charge storage layer to form a dummy gate in the logic region;
patterning the charge storage layer to form a charge storage structure in the NVM region;
forming a second dielectric layer over the semiconductor layer in the NVM region and the logic region, wherein the second dielectric layer surrounds the charge storage structure in the NVM region and the dummy gate in the logic region, and wherein a top surface of the second dielectric layer is substantially coplanar with top surfaces of the charge storage structure and the dummy gate;
removing a portion of the charge storage structure such that the top surface of the charge storage structure is recessed from the top surface of the second dielectric layer;
after the step of removing the portion of the charge storage structure, removing the second dielectric layer from the NVM region while protecting the second dielectric layer in the logic region;
removing the dummy gate in the logic region which results in an opening in the logic region;
forming a third dielectric layer over the semiconductor layer, the charge storage structure in the NVM region, and the second dielectric layer, within the opening in the logic region, and along sidewalls of the charge storage structure, wherein the third dielectric layer is in contact with the semiconductor layer within the opening; and
forming a gate layer over the third dielectric layer in the NVM region and within the opening in the logic region, wherein the gate layer forms a control gate layer in the NVM region that is over and along the sidewalls of the charge storage structure and wherein the gate layer within the opening in the logic region forms a logic gate.

15. The method of claim 14, further comprising:
after the step of removing the second dielectric layer from the NVM region and prior to the step of removing the dummy gate, forming a fourth dielectric layer over the semiconductor layer and the charge storage structure in the NVM region, wherein the third dielectric layer is formed over the fourth dielectric layer in the NVM region.

16. The method of claim 15, wherein the fourth dielectric layer comprises a plurality of layers, each of the plurality of layers comprises a material selected from the group consisting of a nitride, an oxide, and an oxynitride.

17. The method of claim 14, wherein the third dielectric layer comprises a dielectric material having a high dielectric constant.

18. The method of claim 14, wherein the charge storage structure comprises a material selected from the group consisting of polysilicon and nitride.

19. The method of claim 14, further comprising:
forming a control gate extension layer over the control gate layer in the NVM region.

20. A method for forming a semiconductor device having a non-volatile memory (NVM) region and a logic region, the method comprising:
forming a first dielectric layer over a semiconductor layer in the NVM region and the logic region;
forming a charge storage layer over the first dielectric layer in the NVM region and the logic region;
patterning the charge storage layer to form a dummy gate in the logic region;
patterning the charge storage layer to form a charge storage structure in the NVM region;
forming a second dielectric layer over the semiconductor layer in the NVM region and the logic region, wherein the second dielectric layer surrounds the charge storage structure in the NVM region and the dummy gate in the logic region, and wherein a top surface of the second dielectric layer is substantially coplanar with top surfaces of the charge storage structure and the dummy gate;
removing a portion of the charge storage structure such that the top surface of the charge storage structure is recessed from the top surface of the second dielectric layer;
after the step of removing the portion of the charge storage structure, removing the second dielectric layer from the NVM region while protecting the second dielectric layer in the logic region;
forming a third dielectric layer over the semiconductor layer and the charge storage structure in the NVM region and over the second dielectric layer and the dummy gate in the logic region;
removing the dummy gate in the logic region which results in an opening in the logic region;
forming a fourth dielectric layer over the third dielectric layer in the NVM region and over the second dielectric layer and within the opening in the logic region, wherein the fourth dielectric layer is in contact with the semiconductor layer within the opening; and
forming a gate layer over the fourth dielectric layer in the NVM region and within the opening in the logic region, wherein the gate layer forms a control gate layer in the NVM region and the gate layer within the opening in the logic region forms a logic gate.

* * * * *